United States Patent
Shido et al.

(10) Patent No.: US 9,472,775 B2
(45) Date of Patent: Oct. 18, 2016

(54) ORGANIC ELECTROLUMINESCENT PANEL AND VEHICLE LAMP

(71) Applicant: KOITO MANUFACTURING CO., LTD., Tokyo (JP)

(72) Inventors: Masaya Shido, Shizuoka (JP); Toru Ito, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 158 days.

(21) Appl. No.: 14/335,018

(22) Filed: Jul. 18, 2014

(65) Prior Publication Data

US 2015/0023046 A1    Jan. 22, 2015

(30) Foreign Application Priority Data

Jul. 19, 2013   (JP) .................................. 2013-150687

(51) Int. Cl.
| | |
|---|---|
| *H01L 51/52* | (2006.01) |
| *F21S 8/10* | (2006.01) |
| *H01L 25/04* | (2014.01) |
| *B60Q 1/00* | (2006.01) |
| *B60Q 1/26* | (2006.01) |

(52) U.S. Cl.
CPC ......... *H01L 51/5215* (2013.01); *B60Q 1/0052* (2013.01); *B60Q 1/0058* (2013.01); *B60Q 1/2607* (2013.01); *F21S 48/1154* (2013.01); *F21S 48/212* (2013.01); *F21S 48/215* (2013.01); *F21S 48/217* (2013.01); *F21S 48/2212* (2013.01); *H01L 25/048* (2013.01); *H01L 51/5209* (2013.01); *H01L 51/5212* (2013.01); *H01L 51/5246* (2013.01); *H01L 51/5265* (2013.01); *H01L 51/5271* (2013.01); *H01L 51/5259* (2013.01); *H01L 2251/5361* (2013.01); *H01L 2924/0002* (2013.01)

(58) Field of Classification Search
CPC B60Q 1/0052; B60Q 1/0041; B60Q 1/2607; H01L 2924/0002; H01L 2924/00
See application file for complete search history.

(56) References Cited

U.S. PATENT DOCUMENTS

| | | | |
|---|---|---|---|
| 2003/0143423 A1* | 7/2003 | McCormick | H01L 51/5237 428/690 |
| 2005/0249972 A1* | 11/2005 | Hatwar | H01L 51/5265 428/690 |
| 2011/0157893 A1* | 6/2011 | Ngai | F21S 2/00 362/249.02 |
| 2011/0176324 A1 | 7/2011 | Natsume | |

FOREIGN PATENT DOCUMENTS

JP        2011-150888 A       8/2011

OTHER PUBLICATIONS

Office Action issued in corresponding Chinese Application No. 201410344386.8, mailed on May 4, 2016 (15 pages).

* cited by examiner

*Primary Examiner* — Anne Hines
(74) *Attorney, Agent, or Firm* — Osha Liang LLP

(57) ABSTRACT

An organic electroluminescent panel is provided. The organic electroluminescent panel includes a substrate made of glass or transparent resin, a light emitting portion provided along a peripheral edge of the substrate, and a metal electrode. The light emitting portion comprises a cathode layer, a transparent conductive film having an extension portion, the extension portion extending toward an outer peripheral portion of the substrate and contacting the metal electrode, and an organic light emitting layer provided between the cathode layer and the transparent conductive film. The metal electrode is provided on the outer peripheral portion of the substrate to serve as an anode.

8 Claims, 5 Drawing Sheets

ORGANIC ELECTROLUMINESCENT PANEL AND VEHICLE LAMP

CROSS-REFERENCE TO RELATED APPLICATION

The present application claims priority from Japanese Patent Application No. 2013-150687 filed on Jul. 19, 2013, the entire content of which is incorporated herein by reference.

BACKGROUND OF INVENTION

1. Field of the Invention

The present invention relates to an organic electroluminescent panel and a vehicle lamp having the organic electroluminescent panel.

2. Related Art

A related art vehicle lamp has an organic electroluminescent device as a light source. For example, a related art vehicle lamp has a main light source and a sub light source arranged inside a lamp chamber provided between a housing and a transparent cover. The sub light source has a planar light emitting device configured as an organic electroluminescent device. The planar light emitting device is provided to surround the main light source (see, e.g., JP 2011-150888 A).

When using an organic electroluminescent panel in a vehicle lamp, it is sometimes difficult to provide sufficient luminous intensity required for the vehicle lamp. For example, minimum luminous intensity required for a tail lamp is 4 candela. Tail lamps are often required to have a narrow light emitting portion for the purpose of design. However, organic electroluminescent devices have relatively low brightness. Therefore, it is difficult to satisfy the minimum luminous intensity of 4 candela with an organic electroluminescent panel having a narrow light emitting portion.

SUMMARY OF INVENTION

One or more embodiments of the present invention provides an organic electroluminescent panel capable of achieving improved luminous intensity with a narrow light emitting portion.

According to one or more embodiments of the present invention, an organic electroluminescent panel is provided. The organic electroluminescent panel includes a substrate made of glass or transparent resin, a light emitting portion provided along a peripheral edge of the substrate, and a metal electrode. The light emitting portion includes a cathode layer, a transparent conductive film having an extension portion, the extension portion extending toward an outer peripheral portion of the substrate and contacting the metal electrode, and an organic light emitting layer provided between the cathode layer and the transparent conductive film. The metal electrode is provided on the outer peripheral portion of the substrate to serve as an anode According to this configuration, the organic light emitting layer may be provided directly near the metal electrode serving as the anode for the organic electroluminescence, so as to suppress the brightness degradation due to the voltage drop of the transparent conductive film, thereby improving the brightness of the light emitting portion. Further, the metal electrode may be provided only on the outer peripheral portion of the glass substrate. As a result, by arranging the light emitting portion along a peripheral edge of the glass substrate, it is possible to make a region on an inner side of the light emitting portion transparent, and it is possible to also make the light emitting portion transparent when the lamp is turned off.

A micro-reflective metal layer may be provided between the transparent conductive film and the organic light emitting layer. With this configuration, the light emitting portion can have higher brightness owing to the microcavity effect by the micro-reflective metal layer.

A sealant and/or a desiccant may be provided between the light emitting portion and the peripheral edge of the substrate. With this configuration, it is possible to provide the entire region on an inner side of the light emitting portion as a transparent region.

According to one or more embodiments of the present invention, a vehicle lamp may be provided. The vehicle lamp includes first and second organic electroluminescent panels, each having the configuration described above. The second organic electroluminescent panel is provided in front of the first organic electroluminescent panel. The first organic electroluminescent panel is arranged such that light emitted by the light emitting portion of the first organic electroluminescent panel passes through a region on an inner side of the light emitting portion of the second organic electroluminescent panel. The substrate of the first organic electroluminescent panel has a mirror-finished surface at least on an inner side of the light emitting portion of the first organic electroluminescent panel. With this configuration, in addition to the light emitted directly from the light emitting portions of the first and second organic electroluminescent panels, the light emitted from the back surface of the light emitting portion of the second organic electroluminescent panel is reflected by the minor-finished surface of the first organic electroluminescent panel. As a result, it is possible to provide a vehicle lamp having a feeling of depth with thin configuration.

DETAILED DESCRIPTION

Figure 1:
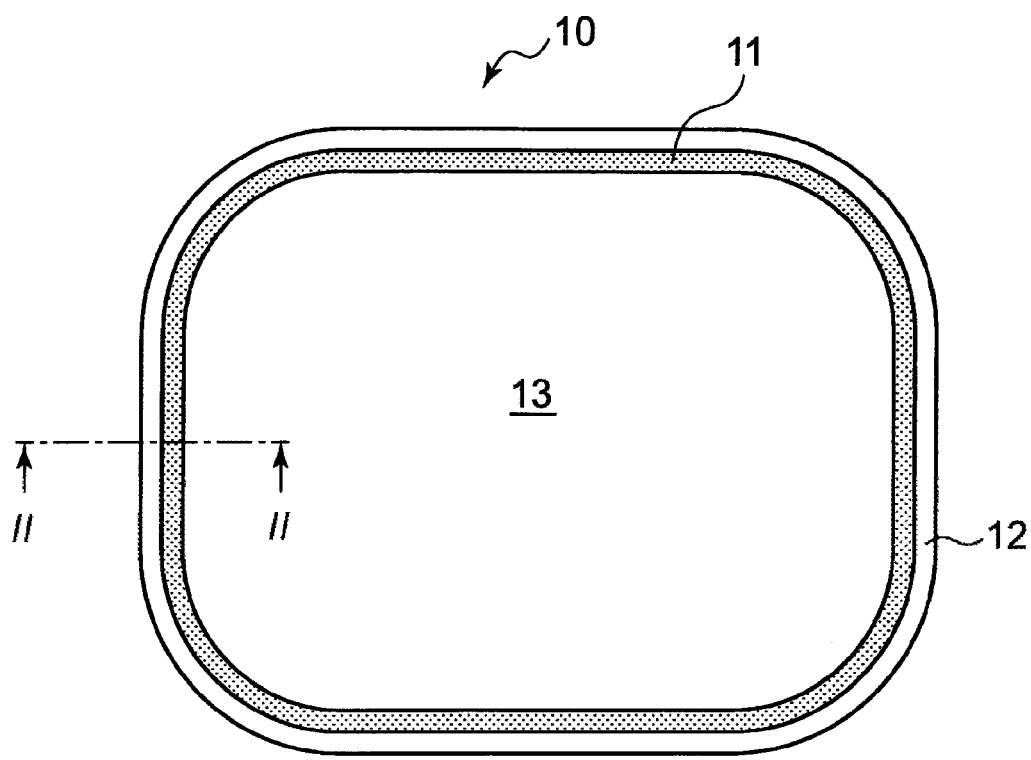
FIG. 1 is a schematic plan view of an organic electroluminescent panel according to one or more embodiments of the present invention.

FIG. 1 is a schematic plan view of an organic electroluminescent panel 10 according to one or more embodiments of the present invention. The organic electroluminescent panel 10 is configured such that a light emitting portion 11 is provided between two glass substrates, each having a substantially rectangular shape. In the illustrated example, the light emitting portion 11 is situated along a peripheral edge of the glass substrates in an annular form. A region on an inner side of the light emitting portion 11 is configured as a transparent region 13 that allows light to pass through.

Figure 2:
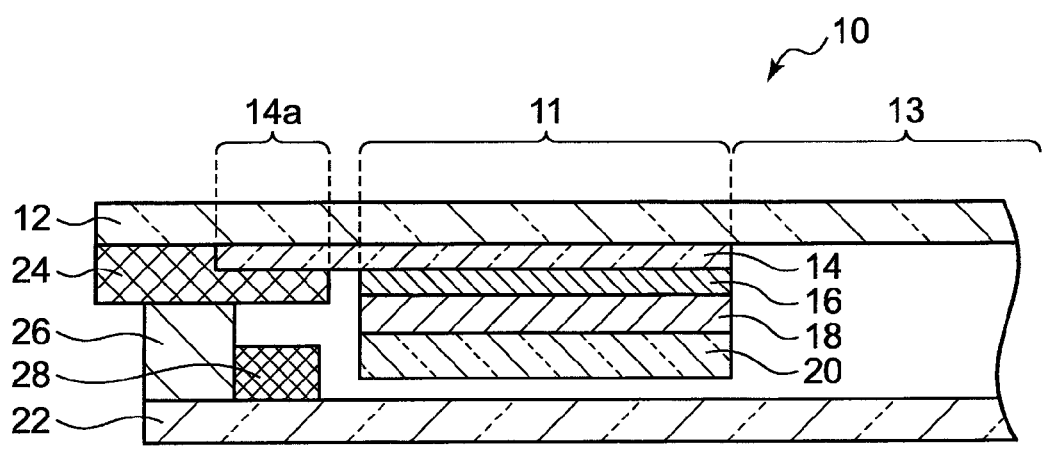
FIG. 2 is a sectional view of the organic electroluminescent panel taken along the line II-II shown in FIG. 1.

FIG. 2 is a sectional view of the organic electroluminescent panel 10 taken along the line II-II shown in FIG. 1. The organic electroluminescent panel 10 has a structure in which a transparent conductive film 14 (e.g., indium tin oxide (ITO)), a micro-reflective metal layer 16, an organic light emitting layer 18, and a cathode layer 20 (a transparent conductive film on the back surface side) are stacked on the back side of the glass substrate 12 and the back side is blocked by the other glass substrate 22. The transparent conductive film 14 includes an extension portion 14a extending toward an outer peripheral portion of the glass substrate 12. A metal electrode 24 serving as an anode is provided on an outer peripheral portion of the glass substrate 12 so as to contact the extension portion 14a. As a distance between the organic light emitting layer and the metal electrode is increased, the brightness of the light emitting portion is reduced by the voltage drop of the metal electrode. According to one or more embodiment, the metal electrode 24 is provided along the entire periphery of the outer peripheral portion of the glass substrate, and the organic light emitting layer 18 is provided directly near the metal electrode 24. As a result, the brightness degradation due to the voltage drop of the metal electrode is suppressed to the minimum and therefore the light emitting portion 11 can have improved brightness.

A microcavity structure is provided by placing the micro-reflective metal layer 16 between the transparent conductive film 14 and the organic light emitting layer 18. Here, a distance between the micro-reflective metal layer 16 and the cathode layer 20 is selected in accordance with the wavelength of the light emitted by the organic light emitting layer 18. By this microcavity structure, the light emitted by the organic light emitting layer 18 is repeatedly reflected between the micro-reflective metal layer 16 and the cathode layer 20 and therefore only a specific resonant wavelength is amplified. In this way, it is possible to further enhance the brightness of the light emitting portion 11.

Because the metal electrode 24 is provided only on the outer peripheral portion of the glass substrate 12, it is possible to make the region on an inner side of the light emitting portion 11 transparent by arranging the light emitting portion 11 along the peripheral edge of the glass substrate 12. The region on the outer side of the light emitting portion 11 is not transparent because the metal electrode 24 is provided. In this region that is not transparent, a sealant 26 (e.g., adhesive) for sealing a space between the glass substrates 12, 22 and a desiccant 28 for dehumidifying the space may be disposed. By placing the metal electrode, the sealant and the desiccant in the region on the outer side of the light emitting portion 11, it is possible to make the entire region on the inner side of the light emitting portion 11 transparent. The light emitting portion 11 also becomes transparent when the lamp is turned off.

The light emitting portion 11 may not be formed in an annular shape, and may be formed in a desired shape. That is, the stacked structure of the transparent conductive film 14, the micro-reflective metal layer 16, the organic light emitting layer 18 and the cathode layer 20 may be provided only on a desired portion along the metal electrode 24. The light emitting portion 11 may be provided in a discontinuous manner. Even in this case, the power may be supplied at only one location, because the metal electrode 24 extends over the entire outer peripheral portion of the glass substrate.

The organic electroluminescent panel 10 can be used as vehicle indication lamps such as, for example, a clearance lamp, a daylight lamp, a turn signal lamp, a tail lamp and a stop lamp. For the organic light emitting layer 18, a suitable material is selected so as to emit light of a color corresponding to the function of the indication lamps. For example, the clearance lamp may be configured to emit white light, the stop lamp may be configured to emit red light, and the turn signal lamp may be configured to emit orange light.

Figure 3:
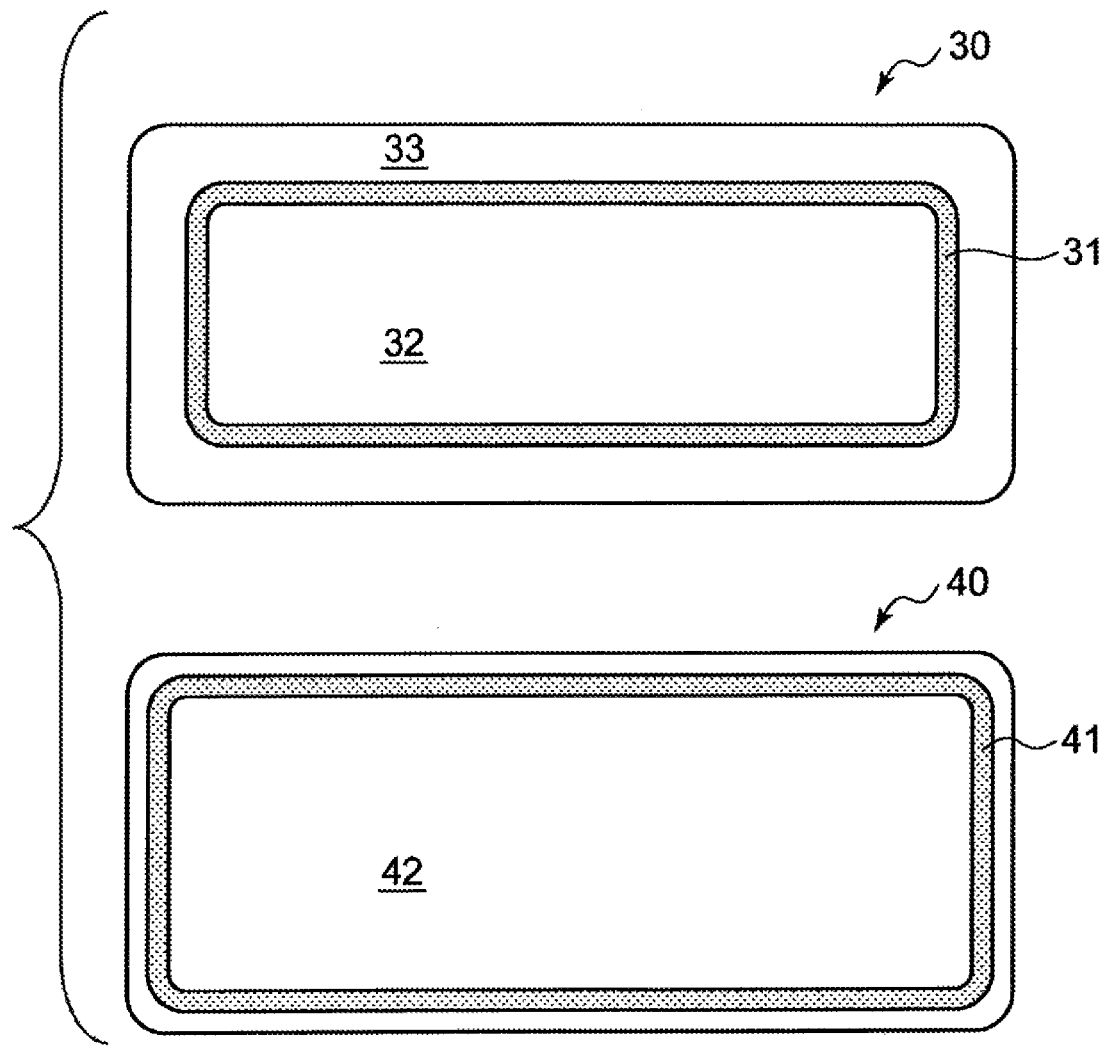
FIG. 3 illustrates organic electroluminescent panels for a vehicle lamp according to one or more embodiments of the present invention.
Figure 4:
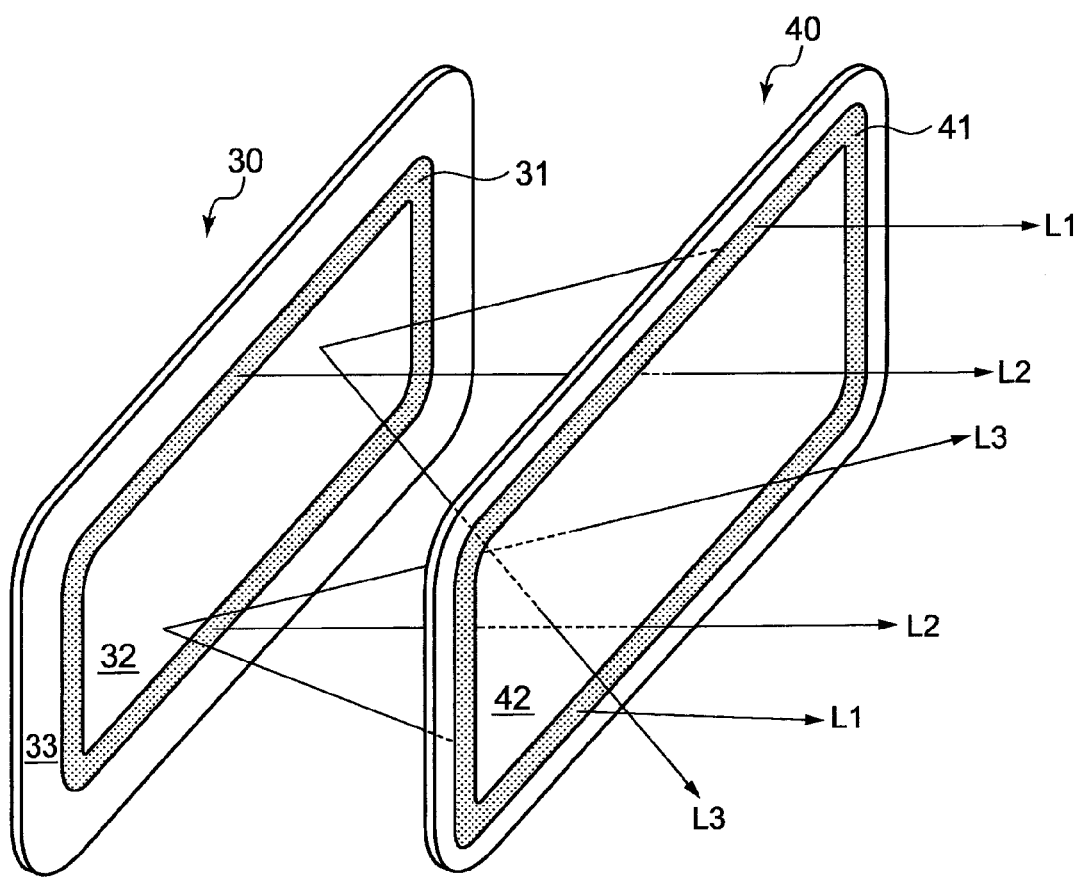
FIG. 4 illustrates an arrangement of the organic electroluminescent panels of FIG. 3 in a vehicle lamp according to one or more embodiments of the present invention.

FIGS. 3 and 4 illustrate an example of a vehicle lamp having organic electroluminescent panels like the one shown in FIGS. 1 and 2.

First, as shown in FIG. 3, two organic electroluminescent panels 30, 40 are prepared. Each of the first organic electroluminescent panel 30 and the second organic electroluminescent panel 40 has an annular light emitting portion 31, 41 provided along a peripheral edge of the glass substrate. The light emitting portion 31 of the first organic electroluminescent panel 30 is located in a region corresponding to on an inner side of the light emitting portion 41 of the second organic electroluminescent panel 40. The inner side of the light emitting portion 41 of the second organic electroluminescent panel 40 is configured as a transparent region 42, like the embodiment of FIG. 1, whereas both the inner side and outer side of the annular light emitting portion 31 of the first organic electroluminescent panel 30 are configured as minor-finished surface regions 32, 33 where the surface of the glass substrate is formed as a minor-finished surface by, for example, metal deposition.

As shown in FIG. 4, the first organic electroluminescent panel 30 and the second organic electroluminescent panel 40 are provided inside a lamp chamber (not shown) defined by a housing and a transparent cover, such that the first organic electroluminescent panel 30 and the second organic electroluminescent panel 40 are spaced away from each other (e.g., by about 2 cm to 5 cm) in a front-rear direction. Specifically, the first organic electroluminescent panel 30 is located on the rear side and the second organic electroluminescent panel 40 is located on the front side, as seen from the front of a vehicle.

In this configuration, when the first and second organic electroluminescent panels are turned on, the light emitted by the light emitting portion 41 of the second organic electroluminescent panel 40 is irradiated directly toward the front of the vehicle (see L1 in FIG. 4). The light emitted by the light emitting portion 31 of the first organic electroluminescent panel 30 is irradiated toward the front of the vehicle through the transparent region 42 of the second organic electroluminescent panel 40 (see L2 in FIG. 4). The light emitted by the light emitting portion 41 of the second organic electroluminescent panel 40 toward the back side is reflected by the mirror-finished surface regions 32, 33 of the first organic electroluminescent panel 30 and is then irradiated toward the front of the vehicle through the transparent region 42 of the second organic electroluminescent panel 40 (see arrow L3 in FIG. 4). In this way, the light is irradiated to the front through various routes. Accordingly, although the space between the panels is narrow, it is possible to achieve a vehicle lamp having a feeling of depth that is deeper than the actual depth, as seen from the front of the vehicle. Further, since the light emitted by the second organic electroluminescent panel 40 toward the back side is reflected by the mirror-finished surface of the first organic electroluminescent panel 30 and is effectively used accordingly, it is possible to enhance the irradiation efficiency of the vehicle lamp as a whole, thereby leading to energy savings.

The first and second organic electroluminescent panels may be simultaneously turned on by being combined as a single lamp. Alternatively, the first organic electroluminescent panel may be configured, for example, as a stop lamp and the second organic electroluminescent panel may be configured, for example, as a tail lamp so that each of the first and second organic electroluminescent panels can be independently turned on. Since a central transparent region of the second organic electroluminescent panel can be utilized to turn on the other lamp from the back side, it is possible to achieve an unconventional lamp design.

While the light emitting portion is provided along the peripheral edge of the glass substrate in an annular form in the organic electroluminescent panels according to the embodiments described above, the light emitting portion may be configured to have a different shape.

Figure 5:
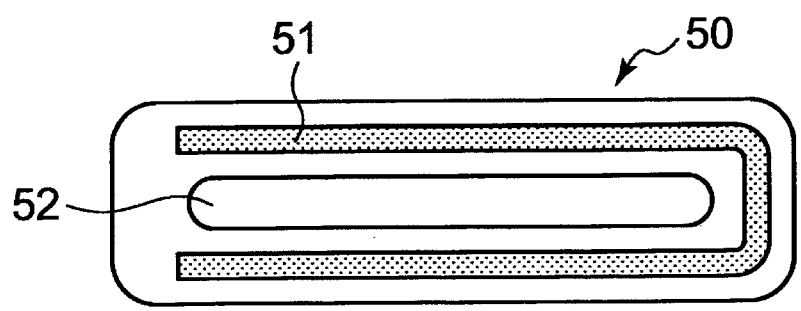
FIG. 5 is a schematic plan view of an organic electroluminescent panel according to one or more embodiments of the present invention.
Figure 6:
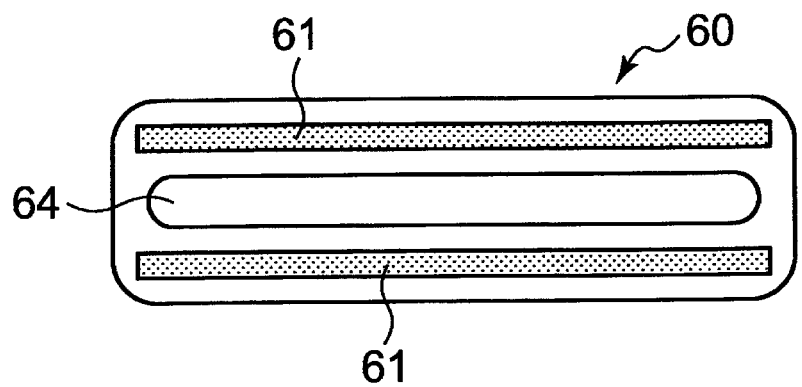
FIG. 6 is a schematic plan view of another organic electroluminescent panel according to one or more embodiments of the present invention.

FIG. 5 illustrates an organic electroluminescent panel 50 in which a light emitting portion 51 is provided along only three sides of a peripheral edge of a rectangular glass substrate in an U shape. FIG. 6 illustrates an organic electroluminescent panel 60 in which light emitting portions 61 are provided along only two, upper and lower sides of a peripheral edge of a rectangular glass substrate in a parallel form.

A lamp unit using a light emitting diode or the like as a light source may be disposed behind the central transparent regions of the organic electroluminescent panels 50, 60. For example, as shown in FIG. 5, a lamp unit 52 may emit light behind a transparent region on the inner side of the U-shaped light emitting portion 51. Alternatively, as shown in FIG. 6, a lamp unit 64 may emit light behind a transparent region on the inner side of the light emitting portions 61 having a parallel form. In these cases, for example, the light emitting portions 51, 61 of the organic electroluminescent panels may be used as a tail lamp and the lamp units 52, 64 may be used as a stop lamp. Instead of such combinations, the light emitting portion of the organic electroluminescent panel may be used as a position lamp and the lamp unit on the back side may be used as a low-beam lamp, a fog lamp, a daytime running lamp or a front turn signal lamp.

Figure 7:
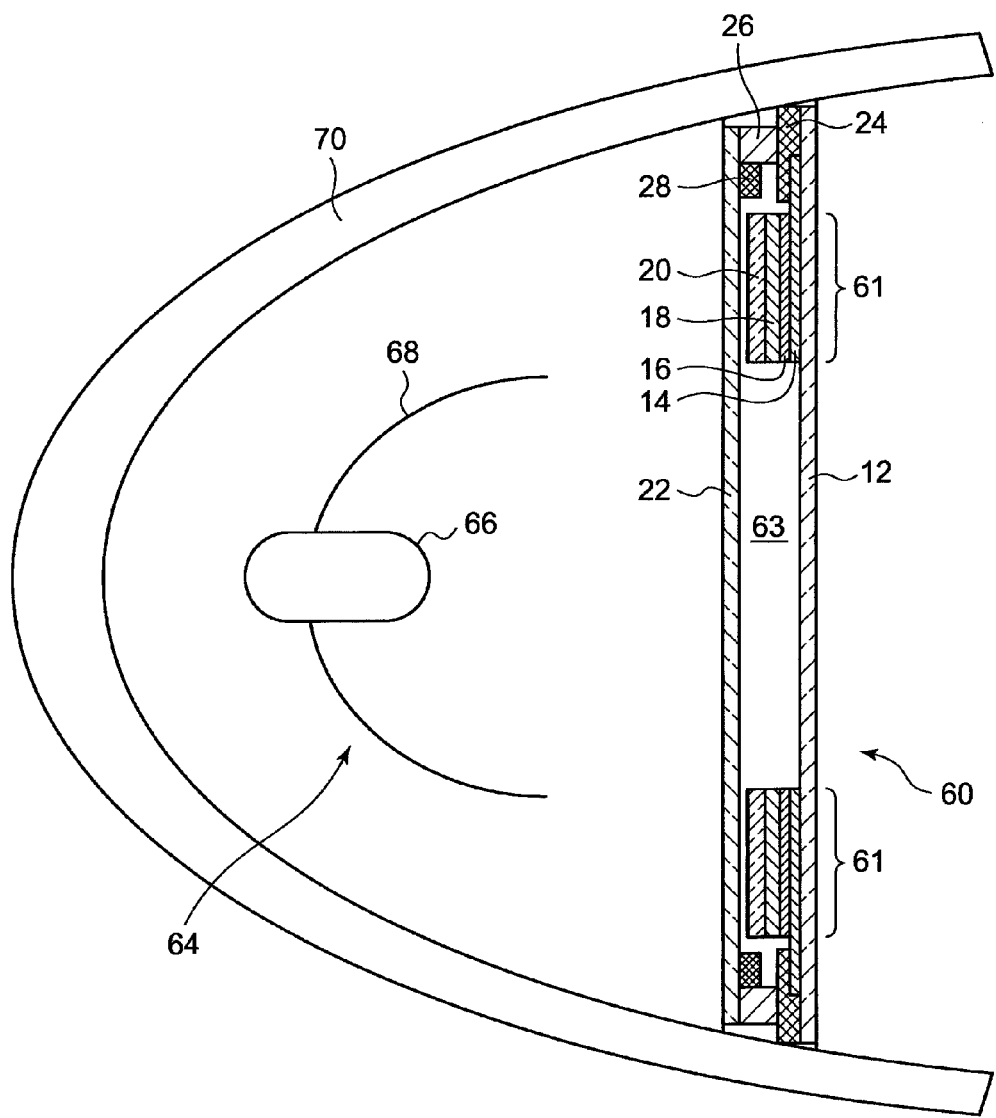
FIG. 7 is a schematic sectional view of a vehicle lamp according to one or more embodiments of the present invention, the vehicle lamp having the organic electroluminescent panel of FIG. 6 in combination with a lamp unit.

FIG. 7 is a schematic sectional view of a lamp having the combination of the organic electroluminescent panel 60 and the lamp unit 64 shown in FIG. 6. The organic electroluminescent panel 60 is fixed to an opening of a casing 70. The lamp unit 64 is disposed inside a lamp chamber defined by the casing 70 and the organic electroluminescent panel 60. The lamp unit 64 is a parabolic-type lamp unit that includes a light emitting diode 66 as a light source and a reflector 68. The lamp unit 64 is disposed so as to be located at behind a transparent region on the inner side of the light emitting portion 61 of the organic electroluminescent panel, as seen from the front. A structure of the organic electroluminescent panel 60 is similar to that described in FIG. 2 and the same reference signs are attached to the corresponding portions.

As shown in FIG. 7, in the case of using a combination of the organic electroluminescent panel and the lamp unit, a space 63 between the glass substrates 12, 22 of the organic electroluminescent panel may be filled with a transparent resin. Generally, the difference in refractive index of the transparent resin and glass is smaller than the difference in refractive index of the glass and air. Therefore, a refraction angle at the interface between the glass substrate and the transparent resin is reduced when the space 63 is filled with the transparent resin. As a result, the light distribution accuracy of the lamp unit 64 disposed behind the organic electroluminescent panel 60 is improved and it is also possible to enhance the utilization efficiency of the light.

As described above, according to one or more embodiment, the organic light emitting layer is provided close to the metal electrode serving as an anode of the organic electroluminescent panel, and the micro-reflective metal layer is provided between the organic light emitting layer and the glass substrate. With this configuration, it is possible to realize an organic electroluminescent panel having an improved brightness with a narrow light emitting portion, which is suitable for use in, for example, a tail lamp of a vehicle. Further, since the metal electrode, the sealant and the desiccant are provided in the region on the outer side of the light emitting portion, it is possible to realize an organic electroluminescent panel in which the entire region on the inner side of the light emitting portion is configured as a transparent region. Thereby, it is possible to realize a design in which another lamp can emit light from the back side of the organic electroluminescent panel through the transparent region.

While a flat organic electroluminescent panel has been described in the foregoing embodiments, an organic electroluminescent panel according to one or more embodiments of the present invention may be curved or bent by using an ultrathin glass that can provide a curved surface or a transparent resin, instead of the glass substrate.

What is claimed is:

1. An organic electroluminescent panel comprising:
   a substrate made of glass or transparent resin;
   a light emitting portion provided along a peripheral edge of the substrate; and
   a metal electrode,
   wherein the light emitting portion comprises:
      a cathode layer;
      a transparent conductive film having an extension portion, the extension portion extending toward an outer peripheral portion of the substrate so as to extend farther outwards than an outer edge of the cathode layer, and contacting the metal electrode; and
      an organic light emitting layer provided between the cathode layer and the transparent conductive film,
   wherein the metal electrode is provided on the outer peripheral portion of the substrate to serve as an anode.

2. The organic electroluminescent panel according to claim 1, wherein the light emitting portion further comprises a micro-reflective metal layer provided between the transparent conductive film and the organic light emitting layer.

3. The organic electroluminescent panel according to claim 1, further comprising a sealant provided between the light emitting portion and the peripheral edge of the substrate.

4. The organic electroluminescent panel according to claim 3, further comprising a desiccant provided between the light emitting portion and the peripheral edge of the substrate.

5. The organic electroluminescent panel according to claim 1, wherein the metal electrode is provided along an entire periphery of the substrate.

6. The organic electroluminescent panel according to claim 1, wherein an entirety of a contact surface between the transparent conductive film and the metal electrode is disposed farther outwards than the outer edge of the cathode layer.

7. A vehicle lamp comprising:
   a first organic electroluminescent panel; and
   a second organic electroluminescent panel provided in front of the first organic electroluminescent panel, wherein each of the first organic electroluminescent panel and the second organic electroluminescent panel comprises a substrate made of glass or transparent resin, a light emitting portion provided along a peripheral edge of the substrate, and a metal electrode, wherein the light emitting portion comprises a cathode layer, a transparent conductive film having an extension portion, the extension portion extending toward an outer peripheral portion of the substrate and contacting the metal electrode, and an organic light emitting layer provided between the cathode layer and the transparent conductive film, and wherein the metal electrode is provided on the outer peripheral portion of the substrate to serve as an anode, wherein the first organic electroluminescent panel is arranged such that light emitted by the light emitting portion of the first organic electroluminescent panel passes through a region on an inner side of the light emitting portion of the second organic electroluminescent panel, and wherein the substrate of the first organic electroluminescent panel comprises a mirror-finished surface at least on an inner side of the light emitting portion of the first organic electroluminescent panel.

8. A vehicle lamp comprising:

an organic electroluminescent panel, and a lamp unit disposed behind the organic electroluminescent panel, wherein the organic electroluminescent panel comprises a substrate made of glass or transparent resin, a light emitting portion provided along a peripheral edge of the substrate, and a metal electrode, wherein the light emitting portion comprises a cathode layer, a transparent conductive film having an extension portion, the extension portion extending toward an outer peripheral portion of the substrate and contacting the metal electrode, and an organic light emitting layer provided between the cathode layer and the transparent conductive film, and wherein the metal electrode is provided on the outer peripheral portion of the substrate to serve as an anode, wherein the lamp unit is disposed behind a central portion of the substrate.

* * * * *